US012666626B2

(12) United States Patent
Chang et al.

(10) Patent No.: US 12,666,626 B2
(45) Date of Patent: Jun. 23, 2026

(54) MRAM CIRCUIT AND LAYOUT

(71) Applicant: UNITED MICROELECTRONICS CORP., Hsin-Chu City (TW)

(72) Inventors: Ting-Hao Chang, Kaohsiung City (TW); Chien-Yu Ko, Tainan City (TW); Cheng-Tung Huang, Kaohsiung City (TW); Wen-Liang Huang, Taoyuan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 95 days.

(21) Appl. No.: 18/809,277

(22) Filed: Aug. 19, 2024

(65) Prior Publication Data

US 2026/0040574 A1     Feb. 5, 2026

(30) Foreign Application Priority Data

Jul. 30, 2024    (TW) .................................. 113128199

(51) Int. Cl.
| | |
|---|---|
| *H10B 61/00* | (2023.01) |
| *G11C 11/16* | (2006.01) |
| *H10N 50/10* | (2023.01) |
| *H10N 50/80* | (2023.01) |

(52) U.S. Cl.
CPC .......... *H10B 61/22* (2023.02); *G11C 11/1655* (2013.01); *G11C 11/1657* (2013.01); *H10N 50/10* (2023.02); *H10N 50/80* (2023.02); *G11C 11/161* (2013.01)

(58) Field of Classification Search
CPC . H10B 61/22; G11C 11/1655; G11C 11/1657; G11C 11/161; H10N 50/10; H10N 50/80
USPC ......................................................... 365/158
See application file for complete search history.

(56) References Cited

U.S. PATENT DOCUMENTS

2017/0169873 A1*   6/2017   Appeltans ........... G11C 11/1657

FOREIGN PATENT DOCUMENTS

| | | |
|---|---|---|
| TW | I806071 | 6/2023 |
| WO | 2017176217 | 10/2017 |

* cited by examiner

*Primary Examiner* — Huan Hoang
(74) *Attorney, Agent, or Firm* — Winston Hsu

(57) ABSTRACT

A MRAM circuit is provided in the present invention, wherein each memory cell includes a first transistor with a first gate, a first source and a first drain and the first gate is connected to a first word line, a second transistor with a second gate, a second source and a second drain and the second gate is connected to a second word line, and the second source and the second drain are connected respectively with the first source and the first drain, a first MTJ with one terminal connected to the first drain and the second drain and another terminal connected to a first bit line, and a second MTJ with one terminal connected to the first drain and the second drain and another terminal connected to a second bit line, and a source line connected to the first source and the second source.

10 Claims, 3 Drawing Sheets

MRAM CIRCUIT AND LAYOUT

BACKGROUND OF THE INVENTION

1. Field of the Invention

The present invention relates generally to a MRAM circuit and layout, and more specifically, to a 2T2M (two transistors and two memory devices) MRAM circuit with MTJs sharing the same drain terminal of transistor and layout thereof.

2. Description of the Prior Art

Magnetoresistive random access memory (MRAM) is a kind of emerging memory highly-anticipated in recent years, with advantages comparable to all kinds of existing memory. For example, MRAM has an access speed comparable to SRAM, with non-volatility and low power consumption like Flash, and with high integrity and durability like DRAM. More importantly, the process of manufacturing MRAM devices may be integrated in available semiconductor BEOL (back-end-of-line) process. Thus, it has a potential to become primary memory used in semiconductor chips. The storage device of MRAM, ex. magnetic tunnel junctions (MTJs), is usually arranged in a level between a lower interconnect and an upper interconnect, cooperating with one or more transistors to control circuit switch during read/write operations. Unlike conventional memory using electric charges to store data, an external magnetic field is applied in the operation of MRAM to control magnetization direction of MTJs and implement different tunnel magnetoresistances (TMR), so as to define different storage states for storing digital data.

Due to the variation in process or material, different MTJ units may be provided with different switching properties, namely, it may need different switching pulses to change the magnetization directions of magnetic data layers in different MTJs. When the switching pulse required for switching a first MTJ is larger than the switching pulse required for switching a second MTJ, the first MTJ may be rotated to a predetermined magnetization direction if a switching pulse is applied to MRAM array. However, with respect to the second MTJ, excess switching pulse may cause Joule heating issue, unable to rotate the second MTJ to the predetermined magnetization direction, so that data can't be written correctly into MRAM units. This is commonly known as a back hopping issue in the write operation of MRAM, especially in design of series-connected MTJs.

In response to the miniaturization demand for various electronic produces nowadays, how to accommodate more storage devices in a limited layout area and scale memory cells through IC design for improving layout utilization, and at the same time preventing the back hopping issue in order to maintain better write capability, have become essential topics for those of skilled in the art to develop and research, in hope of applying MRAM more widely and maturely in memory field.

SUMMARY OF THE INVENTION

In the light of the aforementioned demands for miniaturizing memory cells and increasing memory capacity in unit layout area, the present invention hereby provides a novel MRAM circuit and relevant layout, with features of two MTJs sharing drain terminals of transistors to implement 2T2M MRAM circuit, increasing memory capacity in unit layout area. In addition, the circuit design of present invention can solve back hopping issue in the operation of MRAM, improving write capability.

One aspect of the present invention is to provide a MRAM circuit with multiple memory cells, wherein each of the memory cells includes: a first transistor having a first gate, a first source and a first drain, and the first gate is connected to a first word line; a second transistor having a second gate, a second source and a second drain, and the second gate is connected to a second word line, and the second source and the second drain are connected respectively with the first source and the first drain; a first MTJ with one terminal connected to the first drain and the second drain and another terminal connected to a first bit line; a second MTJ with one terminal connected to the first drain and the second drain and another terminal connected to a second bit line; and a source line connected to the first source and the second source.

Another aspect of the present invention is to provide a MRAM layout with multiple memory cells, wherein each of the memory cells includes: a substrate with multiple active areas formed thereon; a first word line and a second word line spaced apart and extending over the active areas on the substrate, wherein the active area at outer side of the first word line is first active area, the active area between the first word line and the second world line is second active area, and the active area at outer side of the second word line is third active area; a first MTJ in BEOL metal layers, with one terminal connected to the second active area and another terminal connected to a first bit line; a second MTJ in the BEOL metal layers with one terminal connected to the second active area and another terminal connected to a second bit line; and a source line in the BEOL metal layers and connected to the first active area and the third active area.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
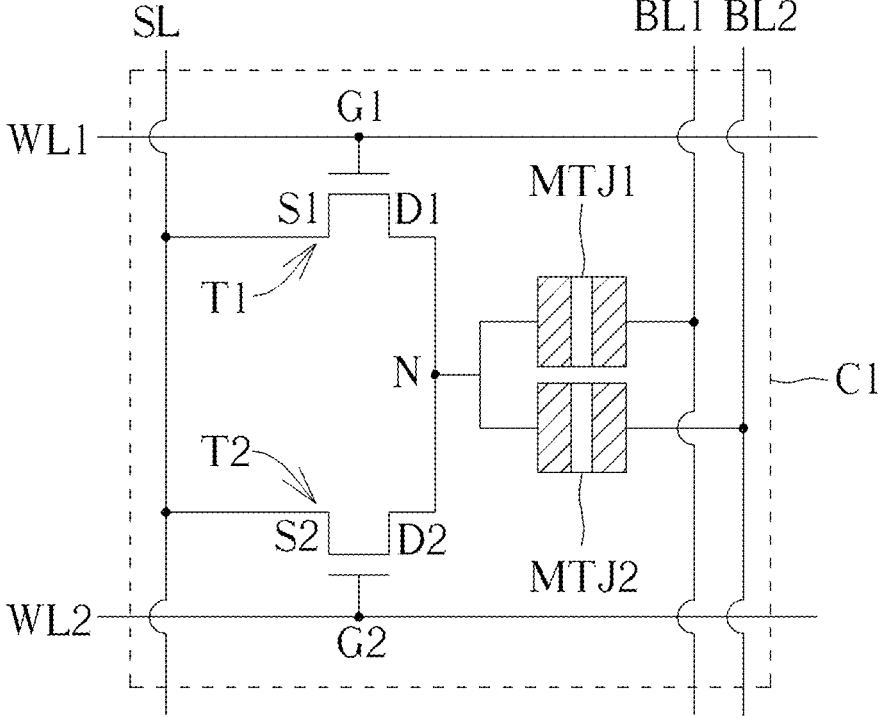
FIG. 1 is a circuit diagram of a MRAM in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). In addition, spatially relative terms (e.g., "beneath," "below," "lower," "above," "upper" and the like) may be used herein for ease of description to describe one element or a relationship between a feature and another element or feature as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Firstly, please refer to FIG. 1, which is a circuit diagram of a MRAM in accordance with the preferred embodiment of present invention. This embodiment takes a 2T2M (two transistors and two memory devices) MRAM cell architecture as an example to describe components and the interconnection therebetween in the MRAM circuit of present invention. Although the memory cell shown in the embodiment is provided with two storage devices, please note that there might be more storage devices included in a memory cell in actual implementation. The scope of present invention is not limited thereto and will be defined by accompanying claims.

The MRAM circuit of present invention includes multiple memory cells, which may be arranged regularly on a layout plane in a cell array or block, and might share a number of word lines and bit lines. For the conciseness of specification, only one memory cell C1 is shown in the circuit of FIG. 1 as an example, and other memory cells in MRAM are considered as having identical or similar structure. As shown in FIG. 1, each memory cell C1 includes two transistors T1, T2 and two storage devices MTJ1, MTJ2 (i.e. magnetic tunnel junction, MTJs). In addition, each memory cell C1 is provided with two bit lines BL1, BL2, one source line SL and two word lines WL1, WL2. In the embodiment, the first transistor T1 and the second transistor T2 are connected in parallel connection, meaning their sources S1, S2 are connected with each other and their drains D1, D2 are connected with each other. In the aspect of circuit, the gates G1, G2 of first transistor T1 and second transistor T2 are connected respectively to the first word line WL1 and second word line WL2. Theses word lines are gates of corresponding transistors in actual structure.

Refer still to FIG. 1. In the embodiment, a junction of the drain D1, D2 of first transistor T1 and second transistor T2 is node N (or referred as storage node), and the sources S1, S2 of first transistor T1 and second transistor T2 are connected to a common source line SL. More specifically, a first MTJ1 and a second MTJ2 are connected on the node N. The two MTJs are components responsible for storing data in the MRAM of present invention. One terminal of the first MTJ1 is coupled to the node N and another terminal of the first MTJ1 is coupled to a first bit line BL1. One terminal of the second MTJ2 is also coupled to the node N and another terminal of the second MTJ2 is coupled to a second bit line BL2. It can be seen that, in the embodiment of present invention, the first MTJ1 and second MTJ2 are connected to a common drain terminal. Please note that the scheme of two MTJs shown in the figure is only an example. In other embodiment, each node may be connected with more than two MTJs in order to implement more storage states and increasing memory capacity in a given layout area.

Figure 2:
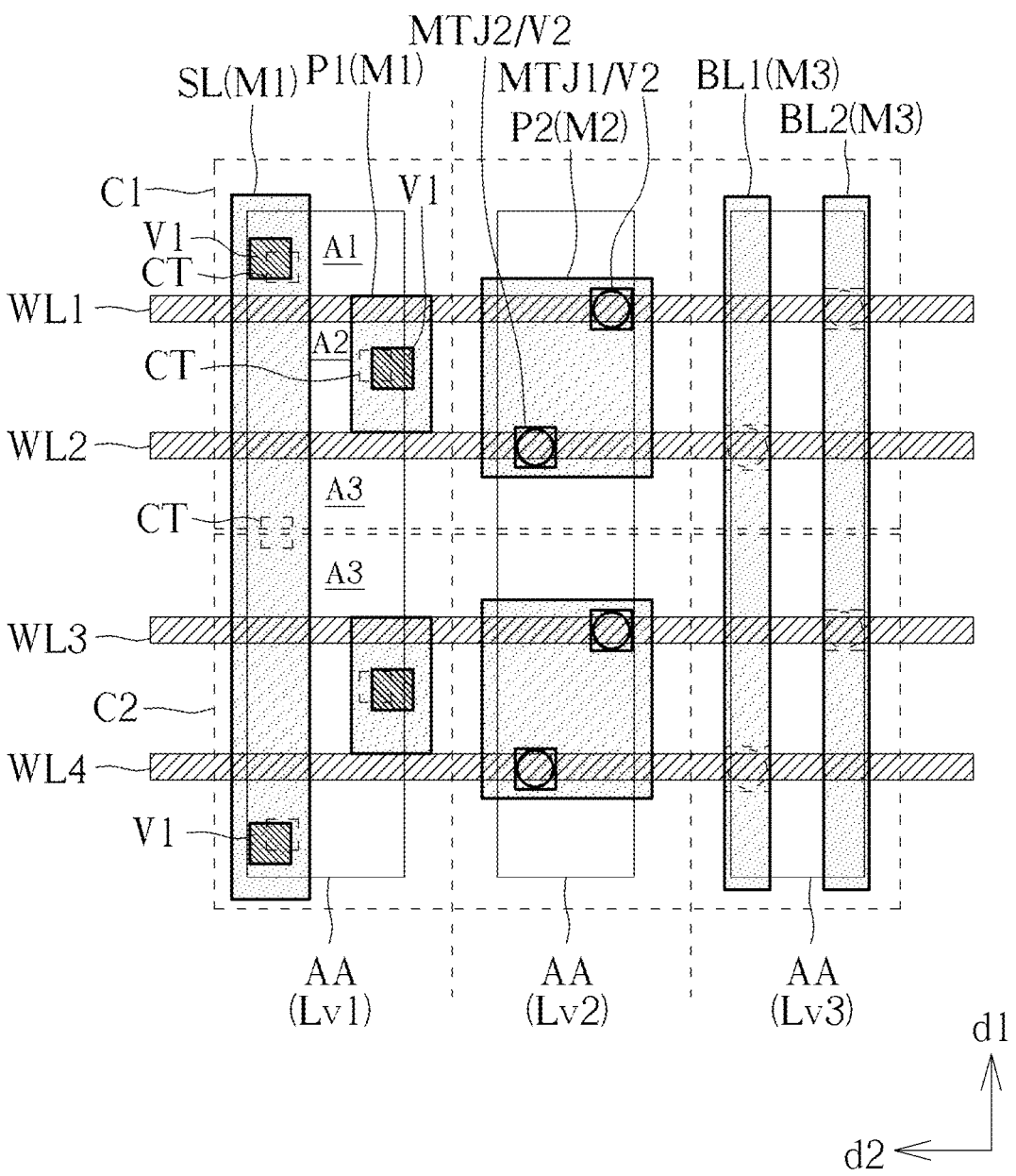
FIG. 2 is a layout of the MRAM in accordance with the preferred embodiment of present invention.
Figure 3:
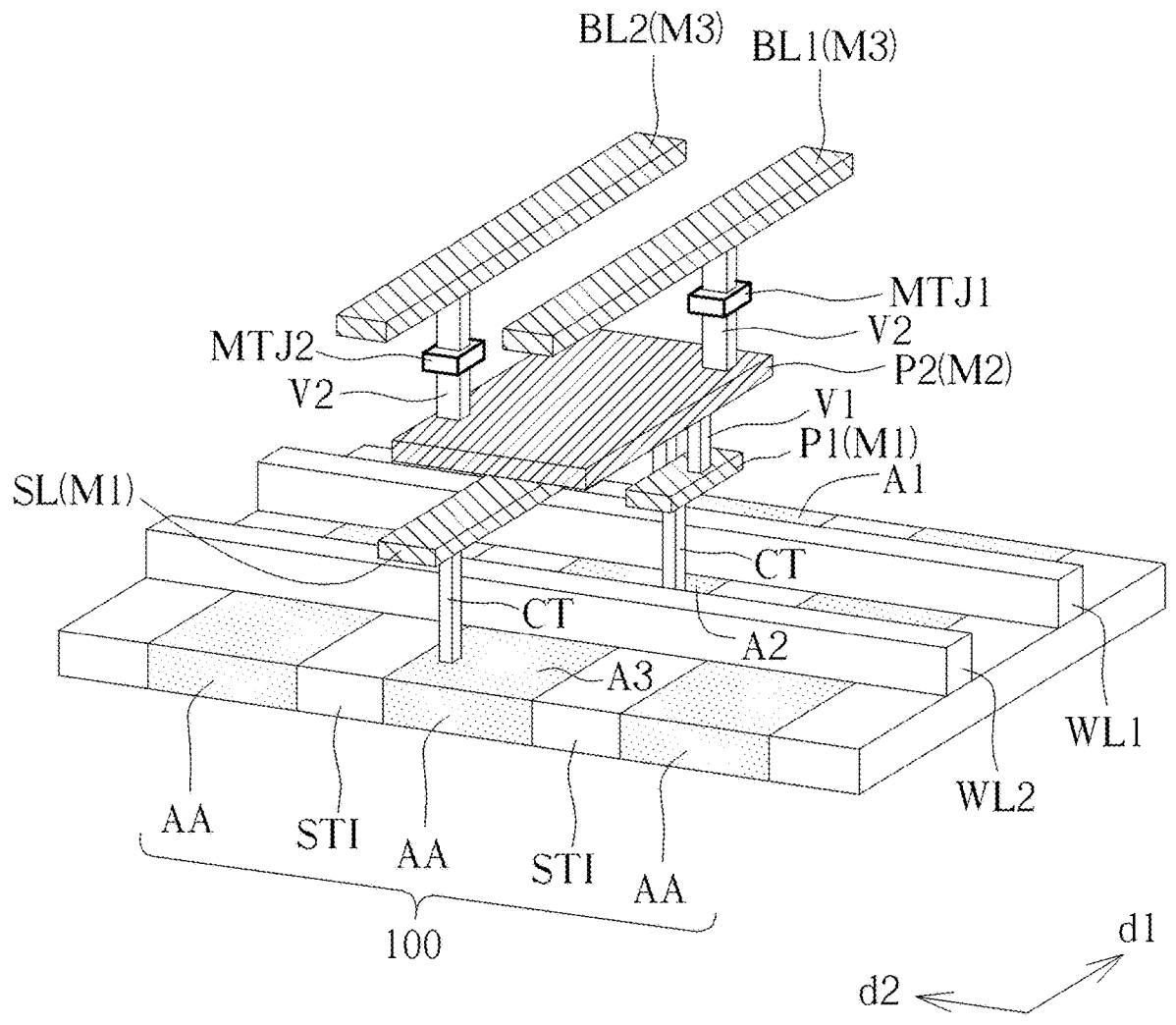
FIG. 3 is an isometric view of the MRAM in accordance with the preferred embodiment of present invention.

After describing the architecture of MRAM circuit in the present invention, please refer to FIG. 2 and FIG. 3 at the same time, which are a layout plane and an isometric view of the MRAM respectively in accordance with the preferred embodiment of present invention, for describing the overlapping patterns and interconnection of the components of MRAM in a vertical direction in actual layout plane of the present invention, in order to provide a better understanding of explicit structure of the MRAM in present invention for readers. Please note that the layout of FIG. 2 is presented in a way displaying multiple layers in single drawing simultaneously, wherein the layout is divided into three sections, including levels Lv1-Lv3. These three sections are completely overlapped with each other in a direction vertical to the substrate, and the active areas AA in the three levels are the same active area. Such presentation approach may provide a clear understanding for reader about the overlapping relation between component patterns of the MRAM of present invention in the vertical direction, and the isometric view of FIG. 3 further illustrates a 3D structure of single memory cell, which is stated herein in advance.

As shown in FIG. 2 and FIG. 3, the MRAM of present invention is set up on a semiconductor device 100. The substrate 100 may be a silicon substrate, multiple active areas AA with different conductivity may be formed therein beforehand through ion implantation process, and silicon oxide based shallow trench isolations (STIs) may be formed to isolate different active areas AA (only one active area shown in the figure). The active area AA extends in a horizontal first direction d1, with multiple word lines, ex. WL1-WL4, spaced apart thereon and extending over the active area AA in a horizontal second direction d2. The second direction d2 is preferably perpendicular to the first direction d1. In the embodiment of present invention, every two word lines are considered as a group to control the switch of transistors in every memory cell (ex. C1) in a corresponding memory row. For example, the word lines WL1-WL2 are considered as a group to control the switch of transistors in memory cell C1, and the word lines WL3-WL4 are considered as a group to control the switch of transistors in memory cell C2.

Refer still to FIG. 2 and FIG. 3. The word lines WL1-WL4 divide every active area AA into multiple active subareas. As shown in the figure, the active area at outer side of the first word line WL1 is first active area A1, the active area between the first word line WL1 and the second word line WL2 is second active area A2, and the active area at outer side of the second word line WL2 (between the second word line WL2 and the third word line WL3) is third active area A3. In the embodiment of present invention, these active areas A1-A3 functions as sources/drains of transistors (i.e. S1, S2 or D1, D2 in FIG. 1). Specifically, the first word line WL1 functions as a gate for the first transistor T1 (FIG. 1), with active areas A1, A2 at two sides functioning respectively as source and drain of the first transistor T1. The second word line WL2 functions as a gate for the second transistor T2 (FIG. 1), with active areas A2, A3 at two sides functioning respectively as source and drain of the second transistor T2. Memory cell C2 has identical configuration as memory cell C1. With this design, the first transistor T1 and second transistor T2 (FIG. 1) in one memory cell share the same active area A2 (meaning their drains are connected with each other in terms of circuits). The active area A2 is the node N in FIG. 1, with first MTJ1 and second MTJ2 connected thereon. Besides, in the embodiment of present invention, the second transistor T2 of memory cell C1 may share the same active area A3 with a first transistor T1 of adjacent memory cell C2 in the first direction d1. The active area A3 and active area A1 are further connected to a common source SL in an upper layer through contacts CT (meaning their sources connected with each other in the circuit).

Refer still to FIG. 2 and FIG. 3. In addition to the active area AA, component patterns in a first metal layer M1 above the active area AA is illustrated in level Lv1. In the embodiment of present invention, the patterns of first metal layer M1 include one source line SL and several patterns P1. More specifically, each memory cell C1, C2 adjacent in the first direction d1 (i.e. in the same memory column) is provided with one common source line SL and one individual pattern P1, wherein the source line SL extends over the word lines WL1~WL4 in the first direction d1 and overlaps the active area AA, and the active areas (ex. A1, A3) at outer sides of each memory cell are connected respectively to the source line SL through contacts CT, and each source line SL is further connected to upper circuit through a via V1 thereon. On the other hand, inner active area A2 in the memory cell is also connected to an upper corresponding pattern P1 of the first metal layer M1 through a contact CT, which is exactly the position of node N in the circuit of FIG. 1, and each pattern P1 is further connected to an upper pattern P2 of the second metal layer M2 and storage devices through another via V1 thereon.

Refer still to FIG. 2 and FIG. 3. Component patterns P2 in the second metal layer M2 above the first metal layer M1 and MTJ1, MTJ2 in the MRAM structure are illustrated in level Lv2. In the level Lv2, each pattern P2 follows the circuit connected upwardly from the active area A2 of memory cell through via V1, and each pattern P2 is further connected to the MTJ1, MTJ2 and circuits like bit line above through via V2. More specifically, in the embodiment of present invention, both MTJ1, MTJ2 are set on the pattern P2 with their layout positions corresponding to the positions of vias V2. The MTJ1, MTJ2 function as storage devices in the MRAM, which are preferably arranged in the BEOL interconnects and might be compatible and integrated in CMOS process nowadays. For example, as shown in the figure, the MTJ1, MTJ2 are preferably set up in the level of via V2 between the second metal layer M2 and the third metal layer M3 (may be inserted in vias V2). More specifically, the first MTJ1 in one memory cell may overlap the pattern P1 and the first word line WL1 below in vertical direction. On the other hand, the second MTJ2 in one memory cell may overlap the source line SL and the second word line WL2 below in vertical direction, so that the positions of two MTJ1, MTJ2 will be staggered in the second direction d2, facilitating the connection with bit lines BL1, BL2 that are spaced apart in the second direction d2 in an upper layer. It can be seen in the figure that the two MTJ1, MTJ2 are connected to a common active area A2 below (i.e. a common drain of the two transistors) through via V2, pattern P2 and contact CT sequentially.

Refer still to FIG. 2 and FIG. 3. In the preferred embodiment of present invention, there are only a first bit line BL1 and a second bit line BL2 in level Lv3, which are parts of the third metal layer M3. The first bit line BL1 and second bit line BL2 extend over multiple word lines WL1-WL4 in the first direction d1 and overlap the active area AA, wherein the first bit line BL1 further overlaps the MTJ1 and pattern P1 below, and the second bit line BL2 further overlaps the MTJ2 and source line SL below. With this design, in the embodiment of present invention, the MTJ1, MTJ2 set on the pattern P2 are connected to corresponding BL1, BL2 respectively through vias V2, and the bit lines BL1, BL2 are further shared by MTJ1, MTJ2 in all of the memory cells (ex. C1, C2) in corresponding memory column.

It can be understood from the embodiments above that the present invention features a design of at least two MTJs set at common drain terminals of transistors to improve memory capacity in unit layout area. Furthermore, since those MTJs are not series-connected like the ones in the design of conventional skill, back-hopping issue in the operation of MRAM may be properly solved, improving the write capability of MRAM. In addition, the memory layout of present invention is similar to the layout of current 2T1M MRAM architecture, so that it may be manufactured using the same available process without problems and challenges in the aspect of design rule, which is the advantage and non-obviousness of present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MRAM circuit with multiple memory cells, wherein each of said memory cells comprises:

a first transistor, comprising a first gate, a first source and a common drain, and said first gate is connected to a first word line;

a second transistor, comprising a second gate, a second source and said common drain, and said second gate is connected to a second word line, and said second source is connected with said first source;

a first MTJ, with one terminal connected to said common drain and another terminal connected to a first bit line;

a second MTJ, with one terminal connected to said common drain and another terminal connected to a second bit line; and a source line, connected to said first source and said second source.

2. A MRAM layout with multiple memory cells, wherein each of said memory cells comprises:

a substrate, with multiple active areas formed thereon;

a first word line and a second word line, spaced apart and extending over said active areas on said substrate, wherein said active area at outer side of said first word line is first active area, said active area between said first word line and said second world line is second active area, and said active area at outer side of said second word line is third active area;

a first MTJ in back-end-of-line metal layers, with one terminal connected to said second active area and another terminal connected to a first bit line;

a second MTJ in said back-end-of-line metal layers, with one terminal connected to said second active area and another terminal connected to a second bit line; and a source line in said back-end-of-line metal layers and connected to said first active area and said third active area.

3. The MRAM layout of claim 2, wherein said first word line, said first active area and said second active area constitutes a first transistor, and said second word line, said second active area and said third active area constitutes a second transistor, and said second active area is drain shared by said first transistor and said second transistor.

4. The MRAM layout of claim 2, wherein said source line is in a level of first metal layer (M1).

5. The MRAM layout of claim 4, wherein said source line is connected to said first active area and said third active area through contacts.

6. The MRAM layout of claim 2, wherein said first bit line and said second bit line are in a level of third metal layer (M3).

7. The MRAM layout of claim 2, wherein said first MTJ and said second MTJ are in a level between second metal layer (M2) and third metal layer (M3).

8. The MRAM layout of claim 7, wherein said first MTJ and said second MTJ are in vias between said second metal layer (M2) and said third metal layer (M3).

9. The MRAM layout of claim 2, wherein said first MTJ and said second MTJ are connected to a second pattern of second metal layer (M2), said second pattern is further connected to a first pattern of first metal layer (M1), and said first pattern is further connected to said second active area.

10. The MRAM layout of claim 2, wherein said first bit line, said second bit line and said source line extend in a first direction, and said first word line extends in a second direction perpendicular to said first direction.

* * * * *